(12) United States Patent
Lye et al.

(10) Patent No.: US 7,473,889 B2
(45) Date of Patent: Jan. 6, 2009

(54) OPTICAL INTEGRATED CIRCUIT PACKAGE

(75) Inventors: Poh-Huat Lye, Penang (MY); Ak-Wing Leong, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 387 days.

(21) Appl. No.: 11/015,900

(22) Filed: Dec. 16, 2004

(65) Prior Publication Data

US 2006/0131477 A1  Jun. 22, 2006

(51) Int. Cl.
*H01J 5/02* (2006.01)
*H01J 40/14* (2006.01)

(52) U.S. Cl. .................. 250/239; 250/208.1
(58) Field of Classification Search ......... 250/208.1, 250/239, 214.1, 214 R; 257/431–434, 680, 257/704, 678, 690, 693, 734, 773, 787
See application file for complete search history.

(56) References Cited

U.S. PATENT DOCUMENTS

| | | | | |
|---|---|---|---|---|
| 4,054,938 A * | 10/1977 | Morris, Sr. | ................. | 361/764 |
| 4,079,511 A * | 3/1978 | Grabbe | ................. | 29/827 |
| 4,152,624 A * | 5/1979 | Knaebel | ................. | 313/499 |
| 4,953,006 A * | 8/1990 | Kovats | ................. | 257/680 |
| 5,302,778 A * | 4/1994 | Maurinus | ................. | 174/521 |
| 5,451,715 A * | 9/1995 | Hundt et al. | ................. | 174/524 |
| 5,608,267 A * | 3/1997 | Mahulikar et al. | ................. | 257/796 |
| 5,869,883 A * | 2/1999 | Mehringer et al. | ................. | 257/667 |
| 6,034,441 A * | 3/2000 | Chen | ................. | 257/787 |
| 6,274,927 B1 * | 8/2001 | Glenn | ................. | 257/680 |
| 6,300,673 B1 * | 10/2001 | Hoffman et al. | ................. | 257/666 |
| 6,392,703 B1 * | 5/2002 | Uchino et al. | ................. | 348/373 |
| 6,445,060 B1 * | 9/2002 | Courtenay et al. | ................. | 257/666 |
| 6,518,659 B1 * | 2/2003 | Glenn | ................. | 257/704 |
| 6,653,661 B2 * | 11/2003 | Okazaki | ................. | 257/98 |
| 6,726,375 B2 * | 4/2004 | Kato et al. | ................. | 385/88 |
| 6,759,266 B1 * | 7/2004 | Hoffman | ................. | 438/64 |
| 6,882,020 B2 * | 4/2005 | Kobayashi et al. | ................. | 257/433 |
| 7,064,403 B2 * | 6/2006 | Weiblen et al. | ................. | 257/428 |
| 7,071,523 B2 * | 7/2006 | Yano et al. | ................. | 257/433 |
| 7,088,397 B1 * | 8/2006 | Hunter et al. | ................. | 348/374 |
| 2003/0066955 A1 * | 4/2003 | Schaub et al. | ................. | 250/239 |
| 2003/0218228 A1 * | 11/2003 | Furukawa et al. | ................. | 257/432 |
| 2004/0046222 A1 * | 3/2004 | Nagai et al. | ................. | 257/433 |
| 2004/0070076 A1 * | 4/2004 | Hayashimoto et al. | ................. | 257/749 |
| 2005/0236644 A1 * | 10/2005 | Getten et al. | ................. | 257/106 |

* cited by examiner

*Primary Examiner*—Seung C Sohn

(57) ABSTRACT

An optical device and method for making the same is disclosed. The device includes having a circuit element that is located in an opaque enclosure. The circuit element includes a die having an optical integrated circuit mounted on a carrier. The carrier includes a plurality of conductors connected to the optical integrated circuit. The opaque enclosure has a transparent window therein. The carrier is positioned in the enclosure such that light entering the enclosure through the window illuminates the die. The enclosure further includes an aperture through which the conductors protrude from the enclosure. The enclosure is at least partially filled with a layer of optically transparent material that passes light utilized or generated by said optical integrated circuit. The enclosure can be preformed to a higher degree of precision than that obtainable on conventional packaging fabrication lines.

12 Claims, 3 Drawing Sheets

OPTICAL INTEGRATED CIRCUIT PACKAGE

BACKGROUND OF THE INVENTION

Optical integrated circuits such as optical sensor chips require packages that are more restrictive than normal integrated circuit chips. Consider the packaging of a chip having an imaging array of the type used to construct cameras. The package must have a clear window that will not interfere with the imaging of a scene onto the sensor chip that is internal to the package. Since the packages must be made of a plastic material for reasons of cost, this window must be protected from scratching in subsequent handling and fabrication steps in which the packaged chip is incorporated into a more complex optical system.

Many optical systems in which the package chips are utilized require that the chip be located at a precise position relative to a lens assembly that focuses a scene onto the surface of the chip. In practice the packaged sensor is mounted on some carrier such as a printed circuit board. The fabrication process must rely on the outside surfaces of the package, or the leads extending from the package, to position the chip on the carrier at the proper location relative to other components, such as the lens assembly. Hence, the chip must be mounted at a precise location in the packaging material relative to the outside surfaces of the package. In addition, the outside surfaces must have a greater degree of uniformity than the surfaces normally provided in conventional integrated circuit packages.

In addition, the packages must be light-tight in those areas other than the clear window through which the image is received. Conventional integrated circuit packages are constructed using a single plastic encapsulant. Since a clear area is needed, this encapsulant must be clear and capable of being molded to provide a defined surface through which the image is received. As a result, the sides and back of the package must be further processed to provide the required light-tight enclosure. These additional operations increase the cost of the final packaged sensor.

Finally, the plastics and molding equipment used in the packaging of integrated circuits are not easily adapted to providing optical quality windows in the normal packages. Conventional IC packaging molds do not provide optically flat surfaces or the lens features of the type needed for imaging sensors. The dimensional characteristics of the package depend on the precision of the mold. Molds used in plastic molding operations require periodic polishing to restore the mold surfaces after a large number of parts have been produced. The size of the mold cavity is altered by the polishing operation, and hence, the size of the parts produced by the mold changes slightly with each polishing operation to which the mold is subjected. While these changes are not significant for normal IC packages, the dimensional changes can be greater than the required tolerances for optical packages.

SUMMARY OF THE INVENTION

The present invention includes an optical device that includes a circuit element located in an opaque enclosure. The circuit element includes a die having an optical integrated circuit mounted on a carrier. The carrier includes a plurality of conductors connected to the optical integrated circuit. The opaque enclosure has a transparent window therein. The carrier is positioned in the enclosure such that light entering the enclosure through the window illuminates the die. The enclosure further includes an aperture through which the conductors protrude from the enclosure. The enclosure is at least partially filled with a layer of optically transparent material that passes light utilized by or generated by said optical integrated circuit. The transparent layer contacts the window and the die to form a light pipe from the window to the die. In one embodiment, the enclosure includes a bottom section and a cover and the cover includes the window. The cover may also include the aperture in this embodiment. In another embodiment, the optical integrated circuit is disposed on a surface of the die and the plurality of conductors comprise a plurality of linear conductors that protrude through the aperture at substantially right angles to the surface. In another embodiment, the conductors protrude in a direction substantially parallel to the surface of the die. In one embodiment, the device includes an opaque material that prevents light from entering the enclosure through the aperture. In one embodiment, the window includes a lens. The enclosure includes a premolded plastic enclosure in one embodiment. In one embodiment, the optical integrated circuit generates light of a first wavelength, and the optically transparent material includes a fluorescent material that converts a portion of the light to a second wavelength that is different from the first wavelength.

DETAILED DESCRIPTION OF THE PREFERRED EMBODIMENTS OF THE INVENTION

The present invention utilizes a preformed plastic mold cup to provide the optical and dimensional characteristics needed in the final packaged sensor. The sensor IC is mounted to a carrier that includes the pins needed to connect the sensor to the external circuitry. The mounted sensor is then placed in the mold cup, and the mold cup is filled with a clear plastic to encapsulate the sensor in the mold cup.

Figure 1:
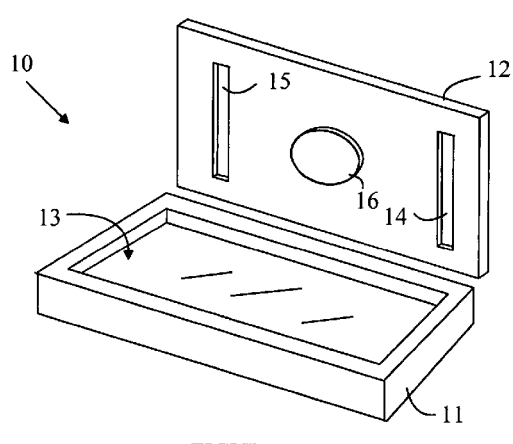
FIG. 1 is a perspective view of a mold cup for use in one embodiment of the present invention.

Refer now to FIG. 1, which is a perspective view of a mold cup for use in one embodiment of the present invention. Mold cup 10 includes a bottom section 11 and top section 12. Bottom section 11 includes a cavity 13 into which a sensor chip that is mounted on a carrier can be inserted. Section 12 includes two slots 14 and 15 that provide access to the leads on the mounted sensor chip. Top section 12 also includes a window feature 16 that extends partially into cavity 13 when top section 12 is seated on bottom section 11. Window feature 16 includes an optically polished surface on the outside section of top 12. The portion of window feature 16 that is located in the cavity is wet by the encapsulating plastic, and hence, small scratches or other optical defects are less important provided the index of refraction of the material from which the window feature is constructed is close to that of the encapsulant.

Figure 2:
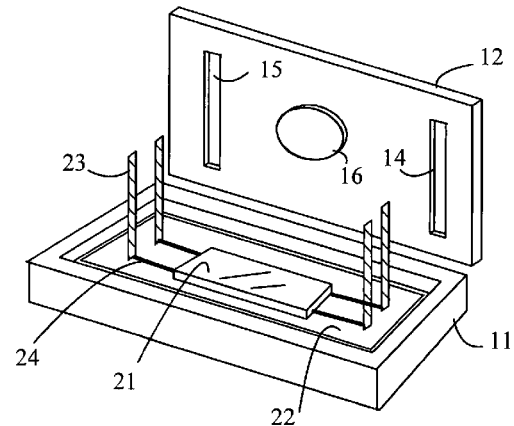
FIG. 2 is a cross-sectional view of a mold cup after a carrier having a sensor chip mounted thereon is placed in the cavity.

Refer now to FIG. 2, which is a cross-sectional view of mold cup 10 after a carrier 22 having a sensor chip 21 mounted thereon is placed in cavity 13. Carrier 22 includes pins 23 that are used to make electrical connections to sensor chip 21. The pins are connected to sensor chip 21 via conductors 24. The nature of the conductors will, in general, depend on the type of carrier used. For example, if carrier 22 is a lead frame, the conductors will typically be wires that are connected between the sensor chip and the lead frame by wires. If the carrier is a printed circuit board, the connections will be traces on the circuit board.

The dimensions of carrier 22 are chosen such that carrier 22 fits into cavity 13 with the precision needed to assure that the imaging array is positioned under window feature 16 at a location that is known relative to the outside dimensions of mold cup 10. If needed, cavity 13 and carrier 22 can include protrusions and matching detents that precisely position carrier 22 in cavity 13. In addition, the position and size of slots 14 and 15 can provide a locating mechanism that depends on the location of pins 23 on carrier 22.

Figure 3:
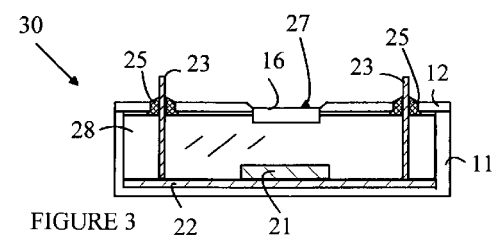
FIG. 3 is a cross-sectional view of an optical sensor after the sensor chip on the carrier has been encapsulated.

Refer now to FIG. 3, which is a cross-sectional view of an optical sensor after the sensor chip on the carrier has been encapsulated. After the carrier having the sensor chip thereon is positioned in bottom section 11, the bottom section is filled with a clear encapsulant 28 to a height that is sufficient to cover the end of window feature 16 when top section 12 is positioned on bottom section 11. Top section 12 is positioned on bottom section 11 while the encapsulant is still in the liquid state. Hence, the surface of window feature 16 is wetted by the encapsulant. As noted above, if the index of refraction of the material from which window feature 16 is constructed is nearly the same as the index of refraction of encapsulant 28, the wetted surface "disappears" and any imperfections either in the surface of the cured encapsulant or the surface of window feature 16 will not interfere with the optical properties of window feature 16.

In one embodiment of the present invention, window feature 16 is recessed into top section 12 as shown in FIG. 3. The recess protects the top surface 27 of window feature 16 from damage during handling.

While the top surface of window feature 27 shown in FIG. 3 is planar, other shapes can be utilized. For example, the top surface of window feature 27 can be shaped to provide a lens that is part of the optical imaging system that inputs the scene to be imaged onto image sensor 21.

As noted above, in many applications, the package surrounding imaging chip 21 must be light-tight with the exception of the light entering through window feature 16. In embodiments that must provide such a light-tight enclosure, the space between slots 14 and 15 and the pins 23 that protrude therethrough is filled with an opaque medium 25 to provide a light-tight seal. In addition, this material seals the package, and hence, prevents material from entering the area between top section 12 and the top of encapsulant layer 28.

Figure 4:
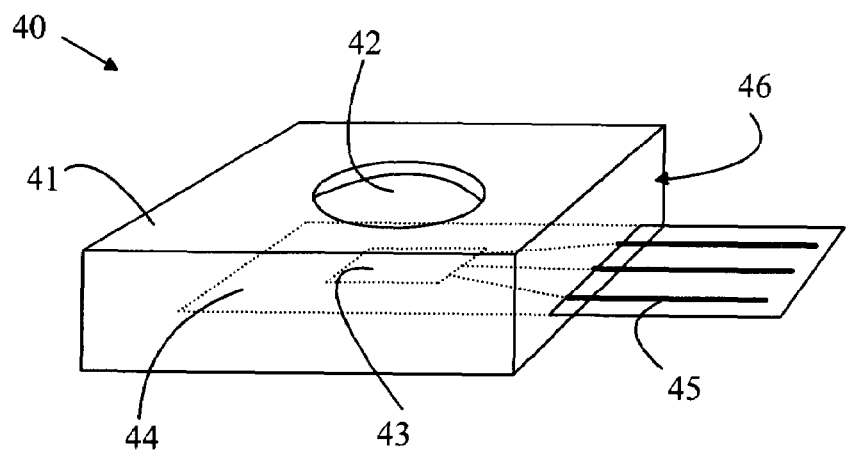
FIG. 4 is a prospective view of an optical device according to another embodiment of the present invention.

The above-described embodiments are particularly well suited to dual in-line packages. However, other arrangements can be utilized. For many applications, an arrangement in which the leads leave the package through one of the sidewalls is preferred. In addition, such an arrangement can be implemented with a one-piece mold cup. Refer now to FIG. 4, which is a prospective view of an optical device according to another embodiment of the present invention. Optical device 40 includes an opaque enclosure 41 having a transparent window 42. A die 43 having an optical imaging array thereon is mounted on a carrier 44. The carrier is positioned in enclosure 41 such that the die is under window 42 and positioned to receive light entering through window 42. Enclosure 41 is filled with a transparent medium that fills the void between carrier 44 and window 42. The transparent medium wets the surface of window 42, and hence, provides a clear light path from the outer surface of window 42 to the imaging array on die 43. Carrier 44 also includes a number of leads 45 that extend in a direction substantially parallel to the surface of die 43 and protrude from enclosure 41 along wall 46. The surface of wall 46 is preferably opaque.

Figure 5:
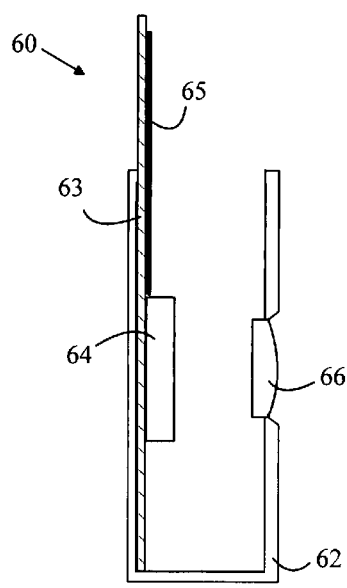
FIGS. 5-7 are cross-sectional views of an optical device according to another embodiment of the present invention at selected points in the fabrication process.
Figure 6:
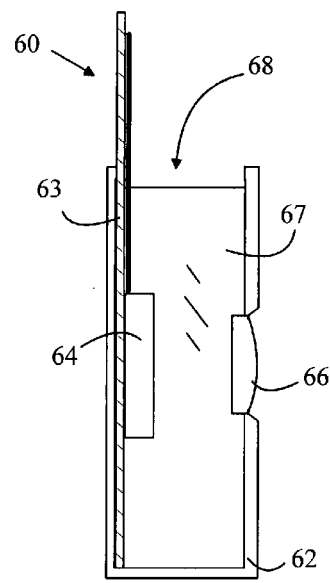
Figure 7:
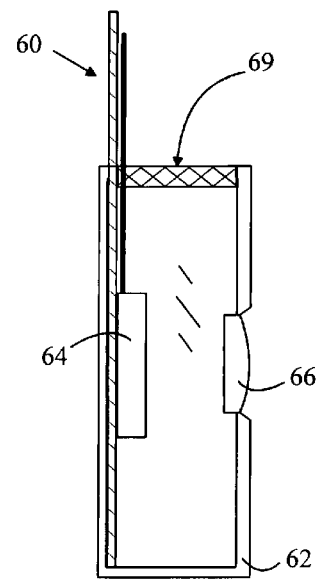

The manner in which an optical device such as that shown in FIG. 4 is constructed can be more easily understood with reference to FIGS. 5-7, which are cross-sectional views of an optical device 60 at selected points in the fabrication process. Refer now to FIG. 5. An optical integrated circuit 64 that is mounted on a carrier 63 is inserted into the cavity of enclosure 62. Carrier 63 includes a plurality of leads 65 that extend in a direction substantially parallel to the surface of die 64 and protrude from the open end of enclosure 62. Enclosure 62 is preferably constructed from an opaque plastic with the exception of window 66, which is transparent to light of the wavelengths utilized by the optical integrated circuit on die 64. In the embodiment shown in FIG. 5, window 66 includes a curved surface that acts as a lens. This lens can image a scene onto the surface of die 64 or be part of a larger optical system that provides light to die 64.

Refer now to FIG. 6. After carrier 63 is positioned in enclosure 62, a portion of the cavity is filled with a transparent medium 67. The transparent medium is preferably an epoxy that is transparent at the wavelengths discussed above. The cavity is filled at least to a height that covers die 64 and window 66. A small area 68 at the top of enclosure 62 is preferably left unfilled. The epoxy preferably wets the surface of window 66 when it is in its procured state.

The epoxy is then cured to its solid form. The epoxy can be cured either by heat or by exposure to radiation of the appropriate wavelength through the open end of enclosure 62. UV curable epoxies are well suited for this application.

Refer now to FIG. 7. After the epoxy has cured, a second layer of epoxy 69 is applied to the open end of enclosure 62. Epoxy layer 69 is constructed from an optically opaque epoxy. This layer provides a light seal to the end of enclosure 62 thereby protecting die 64 from stray light that might otherwise enter through this end.

It should be noted that the completed device has a precise relationship between the optical integrated circuit located on die 64 and the outside of enclosure 62 that is determined by the dimensions of enclosure 62. In addition, the distance between die 64 and lens 66 is precisely set. Since enclosure 62 is molded in a separate process that is remote from the fabrication line, the tolerances of enclosure 62 can be controlled to a high degree without affecting the normal fabrication process.

The above-described embodiments depend on a preformed mold cup that forms the portions of the enclosure that set the position of the die relative to the outside of the enclosure and the window. Injection molding processes for fabricating such enclosures are well known in the art, and hence, will not be discussed in detail here. For the purposes of this discussion, it is sufficient to note that the enclosure can be constructed in a two-step process. In the first step, the opaque portion of the enclosure is molded from a first opaque plastic. The lens portion is then molded in the second step from a plastic that has a lower melting point than that used for the opaque enclosure. Alternatively, the lens can be constructed separately, either from plastic or glass. The lens can then be placed in the mold that forms the opaque portion of the enclosure. In this case, the material from which the lens is constructed must have a higher melting point than the plastic used for the opaque portion of the enclosure.

The above-described embodiments of the present invention utilize a die having an optical imaging array on one surface of the die. However, other forms of optical integrated circuits can be utilized. The present invention is particularly well suited to devices that require precise control of the distance between the die and the clear window through which light enters the device.

The above-described embodiments of the present invention utilize a transparent medium to fill the cavity in the enclosure. However, other materials can be utilized in particular applications. For example, the cavity can be filled with a material that includes a material that filters out particular wavelengths. In another example, the die includes a light source and the cavity is filled with a fluorescent material that converts a portion of the light to light of a different color from that generated on the die. Such light sources form the basis of white light sources constructed from LEDs. In such sources, precise control of the thickness of the phosphor layer is required. Hence, the present invention is also well suited for such applications.

Various modifications to the present invention will become apparent to those skilled in the art from the foregoing description and accompanying drawings. Accordingly, the present invention is to be limited solely by the scope of the following claims.

What is claimed is

1. An optical device comprising:
   a circuit element comprising a die having an optical integrated circuit mounted on a carrier, said carrier comprising a plurality of conductors connected to said optical integrated circuit;
   an opaque pre-molded plastic enclosure having a transparent window therein, said carrier being positioned in said enclosure such that said window is directly above said die and light entering said enclosure through said window illuminates said die, said enclosure further comprising an aperture through which said conductors protrude from said enclosure and an opaque medium in said aperture that prevents light from entering said enclosure except through said window; and
   a layer of optically transparent material within said enclosure, said layer contacting said window and said die, said optically transparent material passing light of a wavelength utilized by, or generated by, said optical integrated circuit.

2. The optical device of claim 1 wherein said enclosure comprises a bottom section and a cover, said cover comprising said window.

3. The optical device of claim 2 wherein said cover further comprises said aperture.

4. The optical device of claim 1 wherein said window comprises a lens.

5. An optical device comprising:
   a circuit element comprising a die having an optical integrated circuit mounted on a carrier, said carrier comprising a plurality of conductors connected to said optical integrated circuit;
   an opaque enclosure having a transparent window therein, said carrier being positioned in said enclosure such that said window is directly above said die and light entering said enclosure through said window illuminates said die, said enclosure further comprising an aperture through which said conductors protrude from said enclosure and an opaque medium in said aperture that prevents light from entering said enclosure except through said window; and
   a layer of optically transparent material within said enclosure, said layer contacting said window and said die, said optically transparent material passing light of a wavelength utilized by, or generated by, said optical integrated circuit, wherein said optical integrated circuit generates light of a first wavelength and wherein said optically transparent material includes a fluorescent material that converts a portion of said light to a second wavelength that is different from said first wavelength.

6. An optical device comprising:
   a circuit element comprising a die having an optical integrated circuit mounted on a carrier, said carrier comprising a plurality of conductors connected to said optical integrated circuit;
   an opaque enclosure having a transparent window therein, said carrier being positioned in said enclosure such that said window is directly above said die and light entering said enclosure through said window illuminates said die, said enclosure further comprising an aperture through which said conductors protrude from said enclosure and an opaque medium in said aperture that prevents light from entering said enclosure except through said window; and
   a layer of optically transparent material within said enclosure, said layer contacting said window and said die, said optically transparent material passing light of a wavelength utilized by, or generated by, said optical integrated circuit, and an opaque material that prevents light from entering said enclosure through said aperture.

7. An optical device comprising:
   a circuit element comprising a die having an optical integrated circuit mounted on a carrier, said carrier comprising a plurality of conductors connected to said optical integrated circuit;
   an opaque enclosure having a transparent window therein, said carrier being positioned in said enclosure such that said window is directly above said die and light entering said enclosure through said window illuminates said die, said enclosure further comprising an aperture through which said conductors protrude from said enclosure and an opaque medium in said aperture that prevents light from entering said enclosure except through said window; and
   a layer of optically transparent material within said enclosure, said layer contacting said window and said die, said optically transparent material passing light of a wavelength utilized by, or generated by, said optical integrated circuit, wherein said enclosure comprises a pre-molded plastic enclosure and said window comprises a plastic having a different melting temperature than said enclosure.

8. An optical device comprising:
   a circuit element comprising a die having an optical integrated circuit mounted on a carrier, said carrier comprising a plurality of conductors connected to said optical integrated circuit;
   an opaque enclosure having a transparent window therein, said carrier being positioned in said enclosure such that said window is directly above said die and light entering said enclosure through said window illuminates said die, said enclosure further comprising an aperture through which said conductors protrude from said enclosure and an opaque medium in said aperture that prevents light from entering said enclosure except through said window; and
   a layer of optically transparent material within said enclosure, said layer contacting said window and said die, said optically transparent material passing light of a wavelength utilized by, or generated by, said optical integrated circuit, wherein said optical integrated circuit comprises an optical imaging array.

9. A method for fabricating an optical device comprising:

mounting a die comprising an optical integrated circuit on a carrier having a plurality of conductors connected to said optical integrated circuit;

placing said carrier into an opaque enclosure having a transparent window therein, said carrier being positioned in said enclosure such that light entering said enclosure through said window illuminates said die and said plurality of conductors protrudes from said opaque enclosure through an aperture in said opaque enclosure;

covering said die with a layer of optically clear material that contacts said window and said die; and applying an opaque material that prevents light from entering said enclosure through said aperture such that light is prevented from entering said enclosure except through said window which is located above said die.

10. The method of claim 9 wherein said optically clear material comprises an epoxy that is placed in said enclosure in liquid form after said carrier has been placed in said enclosure and then cured to a solid form.

11. The method of claim 9 wherein said opaque enclosure comprises a bottom section and a top section and wherein said carrier is placed in said bottom section and then covered with said transparent material, followed by securing said top section to said bottom section.

12. The method of claim 9 wherein said enclosure comprises a pre-molded plastic enclosure.

* * * * *